(12) United States Patent
Cherif et al.

(10) Patent No.: US 12,298,336 B2
(45) Date of Patent: May 13, 2025

(54) LOW POWER PHASE DETECTOR

(71) Applicant: Northrop Grumman Systems Corporation, Falls Church, VA (US)

(72) Inventors: Bouchaib Cherif, Yorktown Heights, NY (US); Max Earl Nielsen, Riverton, UT (US); Robert John March, III, Bel Air, MD (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 163 days.

(21) Appl. No.: 18/328,879

(22) Filed: Jun. 5, 2023

(65) Prior Publication Data

US 2024/0402231 A1 Dec. 5, 2024

(51) Int. Cl.
*G01R 29/08* (2006.01)

(52) U.S. Cl.
CPC ..... *G01R 29/0878* (2013.01); *G01R 29/0892* (2013.01)

(58) Field of Classification Search
None
See application file for complete search history.

(56) References Cited

U.S. PATENT DOCUMENTS

| | | | |
|---|---|---|---|
| 4,870,303 A * | 9/1989 | McGinn | H03D 13/008 327/2 |
| 6,262,628 B1 | 7/2001 | Shinomiya | |
| 6,340,909 B1 | 1/2002 | Zerbe et al. | |
| 6,573,760 B1 | 6/2003 | Gabara | |
| 6,642,746 B2 * | 11/2003 | Donnelly | H03D 13/008 327/7 |
| 8,676,148 B2 | 3/2014 | Ogasawara | |
| 9,608,581 B2 | 3/2017 | Itabashi et al. | |
| 9,768,684 B1 | 9/2017 | Banerjee et al. | |
| 10,574,189 B2 | 2/2020 | Wang et al. | |

(Continued)

FOREIGN PATENT DOCUMENTS

| | | |
|---|---|---|
| CN | 103095222 A | 5/2013 |
| CN | 103219945 A | 7/2013 |
| CN | 104333329 A | 2/2015 |

(Continued)

OTHER PUBLICATIONS

International Search Report for Application No. PCT/US2024/031252 Dated Sep. 12, 2024.

(Continued)

*Primary Examiner* — Eman A Alkafawi
*Assistant Examiner* — Suresh K Rajaputra
(74) *Attorney, Agent, or Firm* — Dority & Manning, P.A.

(57) ABSTRACT

Phase detectors are provided. In one example, The phase detector may include a first transistor leg and a second transistor leg. Each of the first transistor leg and the second transistor leg may include a pair of transistors coupled together at a plurality of common nodes. The phase detector may include an input at the first transistor leg. The input may be configured to receive a first input signal and a second input signal. The phase detect may include an output coupled to the second transistor leg. The output may be configured to provide an output signal. The output signal may include a component indicative of a phase difference between the first input signal and the second input signal.

20 Claims, 5 Drawing Sheets

(56) References Cited

U.S. PATENT DOCUMENTS

2005/0110538 A1* 5/2005 Centurelli ............... H03L 7/085
                                                    327/156
2013/0030881 A1   1/2013 O'Toole et al.

FOREIGN PATENT DOCUMENTS

| CN | 110531825 A | 12/2019 |
| JP | H05175754 A | 7/1993 |
| KR | 1020050119510 A | 12/2005 |
| KR | 1020060088415 A | 8/2006 |
| WO | WO2006041041 A1 | 4/2006 |

OTHER PUBLICATIONS

Wikipedia, Phase Detector, 2018, 5 Pages. Retrieved Jun. 2, 2023 from Weblink: https://en.wikipedia.org/wiki/Phase_detector#Electronic_phase_detector.

* cited by examiner

LOW POWER PHASE DETECTOR

FIELD

The present disclosure relates generally to phase detectors.

BACKGROUND

Phase detectors may be used to detect a phase difference between two or more signals, such as radio frequency signals. Phase detectors may be used for a variety of applications requiring a signal indicative of a phase difference between signals. For instance, a phase detector may be used to test the operation of a phase shifter in a phase array system or to provide an indication of lock for a phase lock loop circuit or other phase sensitive circuitry. Example phase detectors have been implemented using, for instance, a Gilbert multiplier cell. Example phase detectors have also been implemented, for instance, using XOR logic gates.

BRIEF DESCRIPTION

Aspects and advantages of the present disclosure will be set forth in part in the following description, or may be obvious from the description, or may be learned through practice of the present disclosure.

One example aspect of the present disclosure is directed to a phase detector. The phase detector may include a first transistor leg and a second transistor leg. Each of the first transistor leg and the second transistor leg may include a pair of transistors coupled together at a plurality of common nodes. The phase detector may include an input at the first transistor leg. The input may be configured to receive a first input signal and a second input signal. The phase detector may include an output coupled to the second transistor leg. The output may be configured to provide an output signal. The output signal may include a component indicative of a phase difference between the first input signal and the second input signal.

These and other features, aspects, and advantages of the present disclosure will be further supported and described with reference to the following description and appended claims. The accompanying drawings, which are incorporated in and constitute a part of this specification, illustrate embodiments of the disclosure and, together with the description, serve to explain the principles of the disclosure.

BRIEF DESCRIPTION OF THE DRAWINGS

A full and enabling disclosure of the present disclosure directed to one of ordinary skill in the art, is set forth in the specification, which makes reference to the appended figures, in which.

Figure 1:
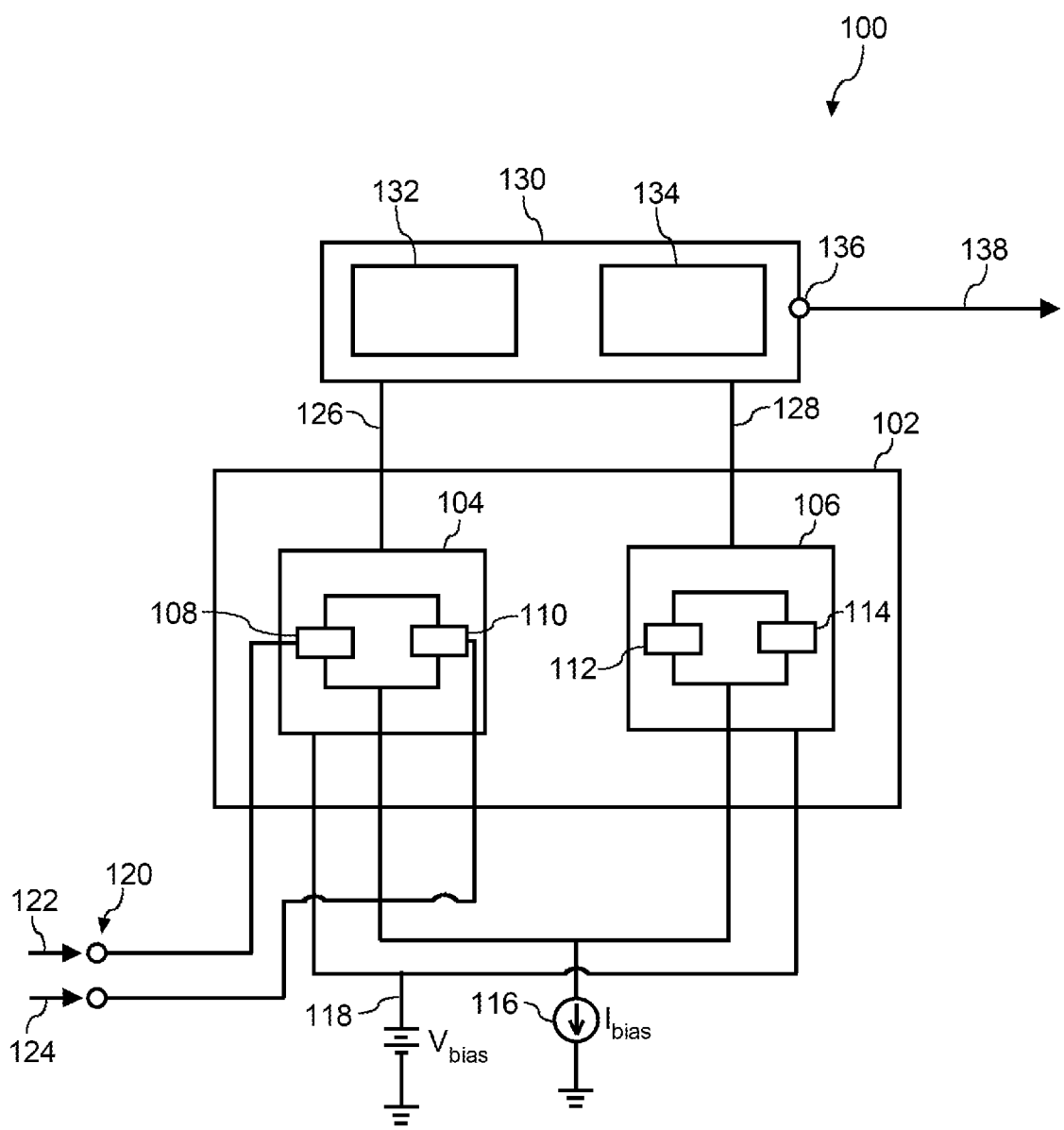
FIG. 1 illustrates a block diagram of a phase detector according to example embodiments of the present disclosure.

Repeat use of reference characters in the present specification and drawings is intended to represent the same or analogous features or elements of the present technology.

DETAILED DESCRIPTION

Reference now will be made in detail to embodiments of the disclosure, one or more examples of which are illustrated in the drawings. Each example is provided by way of explanation of the disclosure, not limitation of the disclosure. In fact, it will be apparent to those skilled in the art that various modifications and variations can be made in the present disclosure without departing from the scope or spirit of the disclosure. For instance, features illustrated or described as part can be used with another embodiment to yield a still further embodiment. Thus, it is intended that the present disclosure covers such modifications and variations as come within the scope of the appended claims and their equivalents.

In this document, relational terms, such as first and second, top and bottom, and the like, are used solely to distinguish one entity or action from another entity or action, without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises . . . a" does not, without more constraints, preclude the existence of additional identical elements in the process, method, article, or apparatus that comprises the element.

The terms "coupled," "fixed," "attached to," and the like refer to both direct coupling, fixing, or attaching, as well as indirect coupling, fixing, or attaching through one or more intermediate components or features, unless otherwise specified herein. Furthermore, any arrangement of components to achieve the same functionality is effectively "associated" such that the functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected" or "operably coupled" to each other to achieve the disclosed functionality, and any two components capable of being so associated can also be viewed as being "operably couplable" to each other to achieve the disclosed functionality. Some examples of operably couplable include, but are not limited to, physically mateable, physically interacting components, wirelessly interactable, wirelessly interacting components, logically interacting, and/or logically interactable components.

Approximating language, as used herein throughout the specification and claims, is applied to modify any quantitative representation that could permissibly vary without resulting in a change in the basic function to which it is related. Accordingly, a value modified by a term or terms, such as "about," "approximately," "generally," and "substantially," is not to be limited to the precise value specified. In at least some instances, the approximating language may correspond to the precision of an instrument for measuring the value, or the precision of the methods or apparatus for constructing or manufacturing the components and/or systems. For example, the approximating language may refer to being within a ten percent margin.

Moreover, the technology of the present application will be described in relation to exemplary embodiments. The word "exemplary" is used herein to mean "serving as an example, instance, or illustration." Any embodiment described herein as "exemplary" is not necessarily to be construed as preferred or advantageous over other embodiments. Additionally, unless specifically identified otherwise, all embodiments described herein will be considered exemplary.

As used herein, the term "and/or," when used in a list of two or more items, means that any one of the listed items can be employed by itself, or any combination of two or more of the listed items can be employed. For example, if a composition or assembly is described as containing components A, B, and/or C, the composition or assembly can contain A alone; B alone; C alone; A and B in combination; A and C in combination; B and C in combination; or A, B, and C in combination.

This written description uses examples to disclose the technology and also to enable any person skilled in the art to practice the technology, including making and using any devices or systems and performing any incorporated methods. The patentable scope of the technology is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal language of the claims.

Example aspects of the present disclosure are directed to a phase detector. The phase detector produces a signal (e.g., a current signal or a voltage signal) that is approximately proportional to the phase difference between two applied input signals, such as two applied radio frequency (RF) input signals.

Phase detectors have been used to detect a phase difference between two applied signals. Phase detectors may include, for instance, a circuit based on a Gilbert multiplier cell and/or one or more XOR gates. In a phase detector including a Gilbert multiplier cell, a first RF signal is applied to a lower differential pair and a second RF signal is applied to an upper differential pair. The voltage difference at the output is proportional to the product of the first RF signal and the second RF signal. Thus, there is a phase dependence for input signals at the same frequency. A phase detector based on XOR gates may require full swing input signals (e.g., between low and high logic states). Two input signals may be provided to the XOR gate. The output of the XOR gate, averaged over time, is proportional to the phase difference between the two input signals.

Example aspects of the present disclosure are directed to a phase detector that includes a transistor core. The transistor core includes, for instance, four transistors or other devices having a nonlinear transconductance. The transistors may be, for instance, field effect transistors (FET)s, bipolar junction transistors (BJTs), insulated gate bipolar transistors (IGBTs), high electron mobility transistors (HEMT), power transistor devices, or other suitable transistors or devices having a nonlinear transconductance. When FETs are used, the transistors may be operated in a saturation region. When BJTs are used, the transistor may be operated in an active forward region. By operating the transistors in these regimes, the transistor core may operate at a high speed. An input with two input signals may be provided to the transistor core. The transistor core provides an output signal that is approximately proportional to the phase difference between the two input signals provided at the input.

In some embodiments, the transistor core may include four transistors. More specifically, the transistor core may include a first transistor leg and a second transistor leg. The first transistor leg may include a pair of transistors coupled together at a common node. The second transistor leg may include a pair of transistors coupled together at a common node.

More particularly, in some examples, the first transistor leg may include a first transistor and a second transistor. The first transistor and the second transistor may be coupled together at a first common source node and a first common drain node. The first input signal may be provided to a gate of the first transistor. The second input RF signal may be provided to a gate of the second transistor. The second transistor leg may include a third transistor and a fourth transistor. The third transistor and the fourth transistor may be coupled together at the first common source node and at a second common drain node.

Certain aspects of the present disclosure are discussed and claimed with reference to a "gate," "source," and "drain" of a transistor. Such terminology is typically used in conjunction with a FET or similar transistor. However, for sake of simplicity, such terms are also used in the present disclosure to refer to embodiments that include a BJT transistor. More particularly, the gate may refer to the base of the BJT. The source may refer to the emitter of the BJT. The drain may refer to the collector of the BJT. Thus, the terms gate and base may be used interchangeably. The terms collector and drain may be used interchangeably. The terms source and emitter may be used interchangeably.

In some embodiments, a bias current source may be coupled to the first common source node. In some embodiments, a DC bias voltage may be coupled to a gate of the third transistor and a gate of the fourth transistor. In some embodiments, the DC bias voltage may be coupled to the gate of the first transistor, the gate of the second transistor, the gate of the third transistor, and the gate of the fourth transistor.

In some embodiments, the phase detector may optionally include a difference circuit. The difference circuit may provide a difference signal. A difference circuit may serve at least two useful functions. First, the difference circuit may remove responses due to common-mode variations, such as those due to temperature, which are seen in the low-frequency components of the individual summed currents associated with a first output signal of the first transistor leg and a second output signal of the second transistor leg. Second, computing the difference between first output signal and the second output signal, rather than using either of the two currents as an output, results in a signal twice as large.

However, those of ordinary skill in the art, using the disclosures provided herein, will understand that the phase detector may provide an output signal without a difference circuit. Despite the advantages provided by the difference circuit, either of the two individual currents of the first transistor leg or the second transistor leg could be used as an output. If only one of the two currents is to be used as the output, it will commonly need to be filtered needs to be filtered to eliminate the unwanted components produced in the transistor quad, and enhance those components which contain information about the phase difference.

The difference circuit may include, for instance, a current mirror circuit and/or a filter circuit. The filter circuit may be a low pass filter configured to provide a band pass response for difference signal components including DC up to some corner frequency. The purpose of filtering in the difference circuit is to reject the frequency at which the input signals are carried, and components at higher frequencies which are generated by the nonlinear behavior of the transistors. These components may not carry readily useful information about the phase relationship between the input signals. In some implementations, it may be beneficial to suppress them so that they do not adversely affect circuits attached to the output.

Although aspects of the present disclosure are discussed with reference to a difference circuit having a low pass filter, the difference circuit may include filtering to select any range of frequencies at which phase carries information. As used herein, the term low-pass filter is intended to encompass any filter considered to provide a band pass response at frequencies below the frequency of the input signals. The term low frequency components refers to frequencies below the frequency of the input signals and includes DC. The difference signal may include a component indicative of a phase difference between the first signal and the second signal. More specifically, if the input signals at the gates of the first transistor and the second transistor are in phase, the difference signal will be at the input frequency. Under that condition, the first transistor and the second transistor together form one half of a differential pair while the third transistor and the fourth transistor form the other half. In this case, no DC component will appear in the difference signal.

By contrast, if the input signals at the gates of the first transistor and the second transistor are 180 degrees out of phase, the non-linear behavior of the transistor core will result in a DC component in the difference signal. The DC component is maximized when the phase difference at the inputs is 180 degrees. At intermediate phase differences, the DC component falls between these two extremes. Thus, the output signal includes a component indicative of the phase difference between the two input signals.

The phase detector may operate at a higher speed relative to, for instance, phase detectors based on a Gilbert cell and/or XOR gate(s). The high speed of the phase detector may result from the common connection of the four transistors in the transistor core at their sources (or emitters of bipolar devices). Because the output signal of the transistor core is at low frequency, the remaining portions of the circuit (e.g., the difference circuit) do not need to respond at the RF frequency. The transistor core does produce a high-frequency voltage signal to the current source. However, the current source typically has high impedance, while the common sources of the transistor core present a low impedance. This reduces the effect of the load presented by the current source. Accordingly, the high-frequency signals are contained within the transistor core. The phase detector can operate at low power because there are four devices in the transistor core there is reduced need to drive additional devices at high frequency.

Aspects of the present disclosure provide a number of technical effects and benefits. For instance, the phase detector according to example embodiments of the present disclosure may have fewer devices in the current paths, leading to higher bandwidth relative to, for instance, a phase detector based on a Gilbert multiplier cell. In addition, the phase detector according to example embodiments of the present disclosure can operate with a lower supply voltage and lower power relative to a phase detector based on a Gilbert multiplier cell.

In addition, XOR gate-based phase detectors may require input signals varying between low and high logic states with rise and/or fall times that are much smaller than a period of the input signal. This can lead to the creation of noise with content at high harmonics which is communicated widely throughout the circuit through power rails and other components. However, the phase detector according to aspects of the present disclosure may receive sinusoidal input signals or other input signals without being restricted to logic level amplitudes and rise/fall times. The phase detector creates less noise at higher harmonics because it can operate with sinusoidal inputs without requiring logic level-based input signals. The phase detector according to example embodiments of the present disclosure may operate at higher frequencies relative to phase detectors based on a XOR gate, with fewer active devices and lower supply current.

Moreover, the phase detector according to example aspects of the present disclosure may be implemented using a smaller semiconductor die area relative to, for instance, a phase detector based on a Gilbert multiplier cell or a XOR gate. As a result, the phase detector may be more suitable for use within larger systems as a lower cost diagnostic tool. Example applications of the phase detector according to examples of the present disclosure may include, for instance, testing a phase shifter in a phased array system or providing an indication of lock in a phase-lock loop system or other phase sensitive circuits.

FIG. 1 depicts a block diagram schematic of an example phase detector 100 according to example embodiments of the present disclosure. Phase detector 100 includes a transistor core 102. Transistor core 102 includes a first transistor leg 104 and a second transistor leg 106.

The first transistor leg 104 includes a first transistor 108 and a second transistor 110. The first transistor 108 and the second transistor 110 may be a FET, BJT, IGBT, HEMT, power transistor, or other transistor. The first transistor 108 and the second transistor 110 may be coupled together at one or more common nodes, such as a common source node and/or a common drain node.

The second transistor leg 106 may include a third transistor 112 and a fourth transistor 114. The third transistor 112 and the fourth transistor 114 may be a FET, BJT, IGBT, HEMT, power transistor, or other transistor. The third transistor 112 and the fourth transistor 114 may be coupled together at one or more common nodes, such as a common source node and/or a common drain node.

A current source 116 may be coupled to the first transistor leg 104 and the second transistor leg 106. The current source 116 may provide a bias current Ibias to each of the first transistor 108, the second transistor 110, the third transistor 112, and the fourth transistor 114. The bias current may be sufficient to operate each of the first transistor 108, the second transistor 110, the third transistor 112, and the fourth transistor 114 such that first transistor 108, the second transistor 110, the third transistor 112, and the fourth transistor 114 operate in a saturation regime (in the case of FETs) or an active forward region (in the case of BJTs) so that first transistor 108, the second transistor 110, the third transistor 112, and the fourth transistor 114 do not act as hard switches and turn completely off. In some embodiments the bias current may be exceedingly small (e.g., close to 0 A or 0 A), such as when FETs are operated in the sub-threshold regime. In such cases, the frequency of the input signals may be low. However, because FETs in subthreshold possess an exponential transconductance, this mode of operation may be suitable for use in the phase detector.

A bias voltage source 118 may provide a bias voltage Vbias to each of the first transistor 108, the second transistor 110, the third transistor 112, and the fourth transistor 114. The same bias voltage may be provided to, for instance, a gate or base of each of the first transistor 108, the second transistor 110, the third transistor 112, and the fourth transistor 114. In some embodiments, the bias voltage may be 0V.

Phase detector 100 includes an input 120. The input 120 may be configured to receive a first input signal 122 and a second input signal 124. Phase detector 100 may be configured to detect a phase difference between the first input signal 122 and the second input signal 124. The frequency of the first input signal 122 and the second input signal 124 may be the same. The frequency of the first input signal 122 and the second input signal 124 may be, for instance, in a range of about 1 MHz to about 50 GHz, such as in a range of about 20 GHz to about 50 GHz. Although these examples of the range of frequency for operation of the phase detector may be regarded as typical, it may operate at much lower and much higher frequencies.

The first input signal 122 and the second input signal 124 may be provided to the first transistor leg 104. For instance, the first input signal 122 may be provided to a gate or a base of the first transistor 108. The second input signal 124 may be provided to a gate or a base of the second transistor 110.

The phase detector 100 may include, in some embodiments, a difference circuit 130. The difference circuit 130 may include, for instance, a current mirror circuit 132 and/or a filter circuit 134. In some embodiments, the current mirror circuit 134 may provide a difference between a first output signal 126 associated with the first transistor leg 104 and a second output signal 128 associated with the second transistor leg 128. The filter circuit 134 may be configured to provide a bandpass response for low frequency components of the difference signal 138 and may block components at higher frequencies. The low frequency components can be associated with frequencies below the frequency of the input signal. Other difference circuits may be used without deviating from the scope of the present disclosure.

The difference circuit 130 may include an output 136. The output 136 of the difference circuit 130 may be the output of the phase detector 100. The difference circuit 130 may provide a difference signal 138 at the output 136. The difference signal 138 may be indicative of a difference between a first output signal 126 associated with the first transistor leg 104 and a second output signal 128 associated with the second transistor leg 128. The difference signal 138 includes a component (e.g., a low frequency component) indicative of a phase difference between the first input signal 122 and the second input signal 124.

More particularly, when the first input signal 122 and the second input signal 124 are in phase, the difference signal 138 will be at the frequency of the input signals. Under that condition, the first transistor 108 and the second transistor 110 together form one half of a differential pair while the third transistor 112 and the fourth transistor 114 form the other half. In this case, no DC component will appear in the difference signal 138.

By contrast, if the first input signal 122 and the second input signal 124 are 180 degrees out of phase, the non-linear behavior of the transistor core 102 will result in a DC component in the difference signal 138. The DC component is maximized when the phase difference of the first input signals 122 and the second input signal 124 is 180 degrees.

At intermediate phase differences, the DC component falls between these two extremes. Thus, the difference signal 138 signal includes a component indicative of the phase difference between the first input signal 122 and the second input signal 124.

Figure 2:
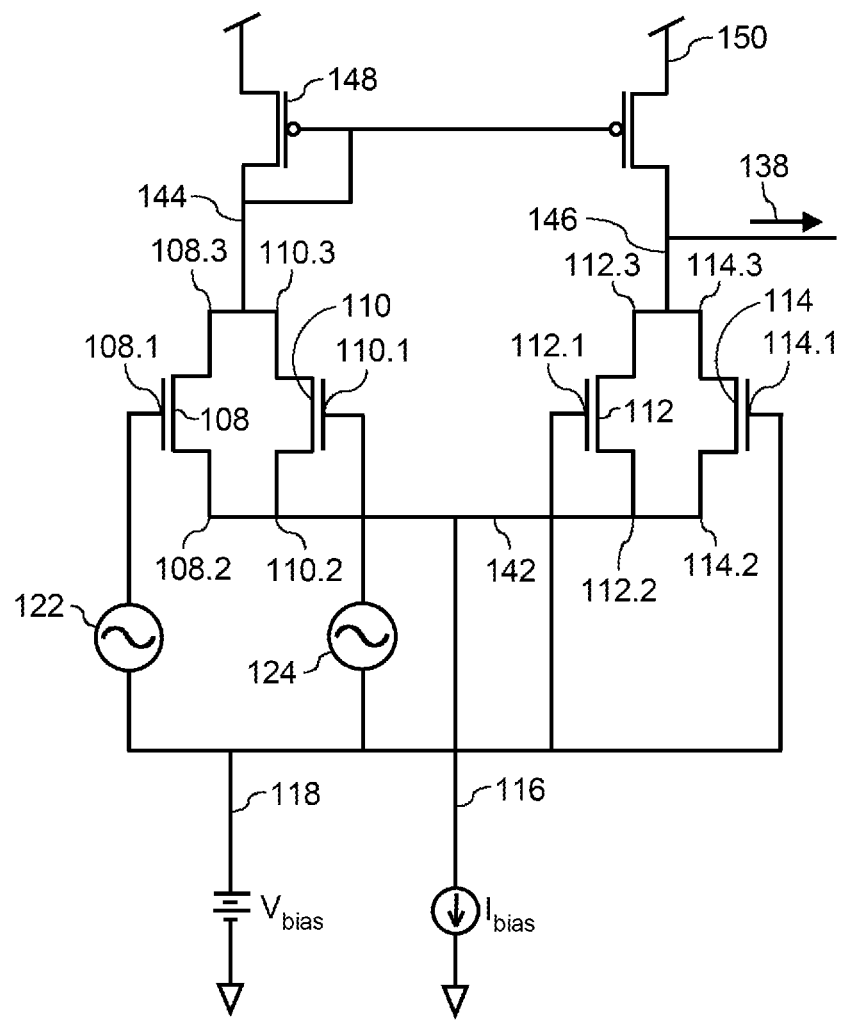
FIG. 2 depicts a circuit diagram of a phase detector according to example embodiments of the present disclosure.

FIG. 2 depicts an example circuit diagram of the phase detector 100 according to example embodiments of the present disclosure. As shown, phase detector 100 includes the first transistor 108, the second transistor 110, the third transistor 112, and the fourth transistor 114. The first transistor 108, the second transistor 110, the third transistor 112, and the fourth transistor 114 are each a FET.

The first transistor 108 includes a first terminal 108.1 (e.g., gate), a second terminal 108.2 (e.g., source), and a third terminal 108.3 (e.g., drain). The second transistor 110 includes a fourth terminal 110.1 (e.g., gate), a fifth terminal 110.2 (e.g., source), and a sixth terminal 110.3 (e.g., drain). The third transistor 112 includes a seventh terminal 112.1 (e.g., gate), an eighth terminal 112.2 (e.g., source), and a ninth terminal 112.3 (e.g., drain). The fourth transistor 114 includes a tenth terminal 114.1 (e.g., gate), an eleventh terminal 114.2 (e.g., source), and a twelfth terminal 114.3 (e.g., drain).

The second terminal 108.2 (e.g., source) of the first transistor 108 is coupled to a first common node 142 (e.g., common source node) with the fifth terminal 110.2 (e.g., source) of the second transistor 110. In addition, the eighth terminal 112.2 (e.g., source) of the third transistor 112 is coupled to the first common node 142 with the eleventh terminal 114.2 (e.g., source) of the fourth transistor 114.

The third terminal 108.3 (e.g., drain) of the first transistor 108 and the sixth terminal 110.3 (e.g., drain) of the second transistor 110 are coupled together at a second common node 144 (e.g., common drain node). The ninth terminal 112.3 (e.g., drain) of the third transistor 112 and the twelfth terminal 114.3 (e.g., drain) of the fourth transistor 114 are coupled together at a third common node 146 (e.g., common drain node 146).

The current source 116 provides a bias current Ibias for the first transistor 108, the second transistor 110, the third transistor 112, and the fourth transistor 114. The current source 116 may be connected to the first common node 142 (e.g., common source node). The bias voltage source 118 may provide a bias voltage Vbias to the first terminal 108.1 (e.g., gate) of the first transistor 108, the fourth terminal 110.1 (e.g., gate) of the second transistor 110, the seventh terminal 112.1 (e.g., gate) of the third transistor 112, and tenth terminal 114.1 (e.g., gate) of the fourth transistor 114. The first transistor 108, the second transistor 110, the third transistor 112, and the fourth transistor 114 may remain in a saturation mode where the drain source voltage exceeds the difference between the gate source voltage and the threshold voltage. In this way, the first transistor 108, the second transistor 110, the third transistor 112, and the fourth transistor 114 are not required to fully switch, allowing for high-speed operation.

The first terminal 108.1 (e.g., gate) of the first transistor 108 is operable to receive the first input signal 122. The fourth terminal 110.1 (e.g., gate) of the second transistor 110 is operable to receive the second input signal 124. The first input signal 122 and the second input signal 124 may have approximately equal amplitudes and/or frequencies.

The sum of currents in the first transistor 108 and the second transistor 110 is formed at the second common node 144 (e.g., common drain node). The sum of currents in the third transistor 112 and the fourth transistor 114 is formed at the third common node 146 (e.g., common drain node). The transistor 148 and the transistor 150 form a current mirror circuit. The current mirror circuit generates a difference current between the sum of the currents of the first transistor 108 and the second transistor 110 and the sum of the currents from the third transistor 112 and the fourth transistor 114. The difference current is formed at the third common node 146 as the output difference signal 138 of the phase detector. The difference signal may be formed by other circuit components without deviating from the scope of the present disclosure. For instance, the transistor 148 and the transistor 150 may be replaced by resistors connected to inputs of a voltage differencing amplifier.

The low frequency component (e.g., DC component present when the phase difference between input signals 122 and 124 is steady in time) of the difference signal is indicative of the phase difference between the first input signal 122 and the second input signal 124. A filter circuit (e.g., low pass filter circuit) may be used to extract the low frequency component (e.g., DC component) of the difference signal from the difference circuit.

Figure 3:
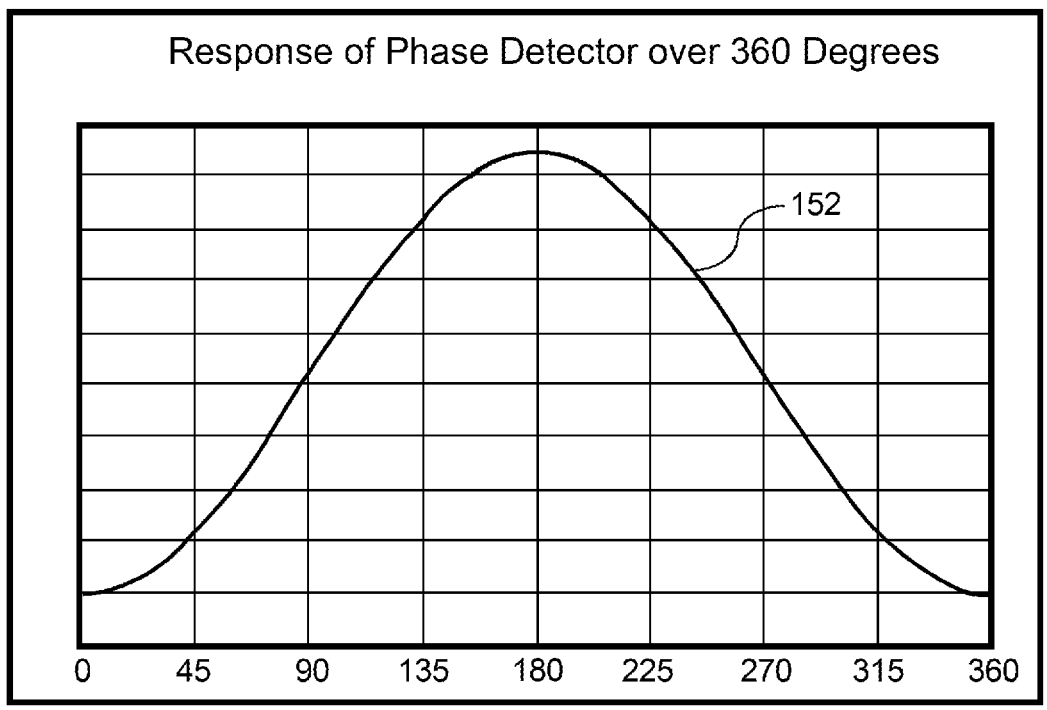
FIG. 3 depicts an output signal of a phase detector as a function of phase difference according to example embodiments of the present disclosure.

FIG. 3 depicts a plot 152 of the low frequency component of the difference signal as a function of phase difference between the first input signal 122 and the second input signal 124 according to example embodiments of the present disclosure. FIG. 3 plots phase difference along the horizontal axis and magnitude (e.g., in voltage, such as mV) along the vertical axis. As shown, there is a direct correlation between a magnitude of the low frequency component of the difference signal and the phase difference between the first input signal 122 and the second input signal 124. More particularly, the response starts at a minimum at about zero degrees, rises to its maximum at about 180 degrees, and drops back to the minimum at about 360 degrees. In other circuit arrangements, the minimum and maximum outputs may occur at 0 degrees and 180 degrees respectively.

Figure 4:
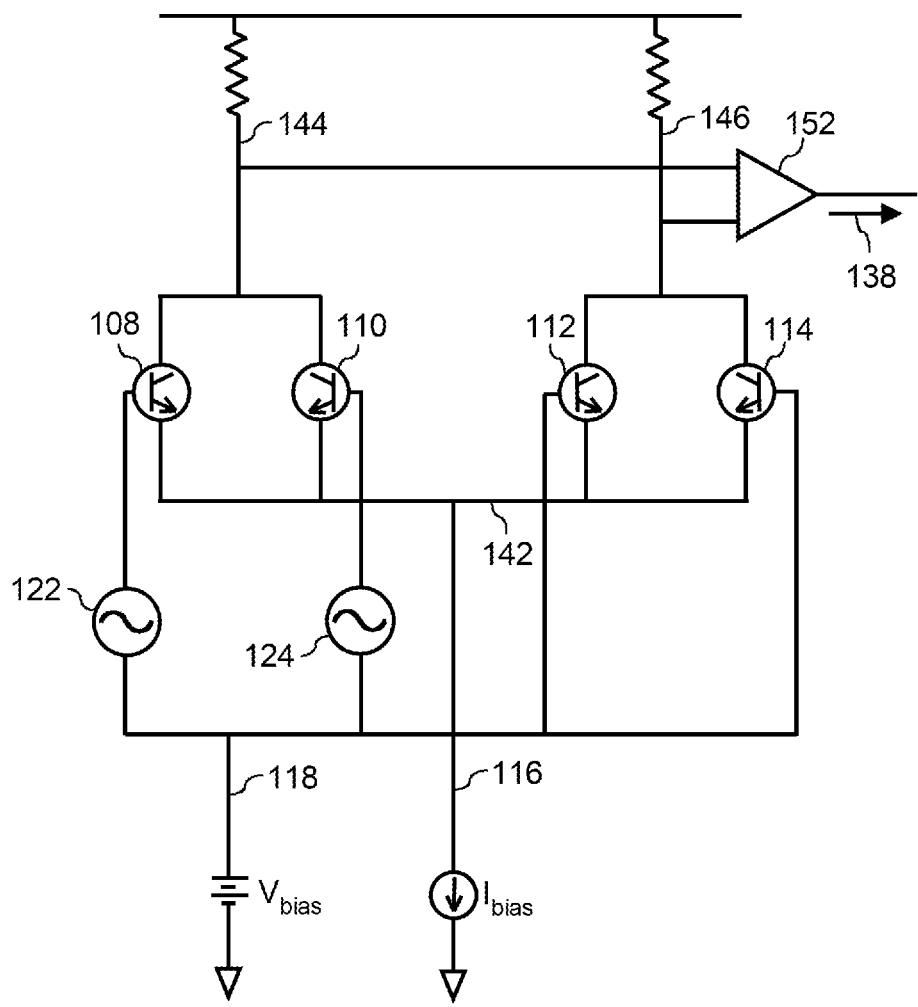
FIG. 4 depicts a circuit diagram of a phase detector according to example embodiments of the present disclosure.

FIG. 4 depicts an example circuit diagram of the phase detector 100 according to example embodiments of the present disclosure. However, in the example of FIG. 4, the first transistor 108, the second transistor 110, the third transistor 112, and the fourth transistor 114 are BJTs. The first transistor 108, the second transistor 110, the third transistor 112, and the fourth transistor 114 may be operated in a regime where the collector potential does not fall below the potential of the base. In this way, the first transistor 108, the second transistor 110, the third transistor 112, and the fourth transistor 114 are not required to fully switch, allowing for high-speed operation.

In addition, in the example embodiment of FIG. 4, the difference circuit is not a current mirror circuit. Rather, the difference circuit includes a differential amplifier 152 configured to provide a difference signal indicative of the difference between signals at the second common node 144 and the third common node 146.

Figure 5:
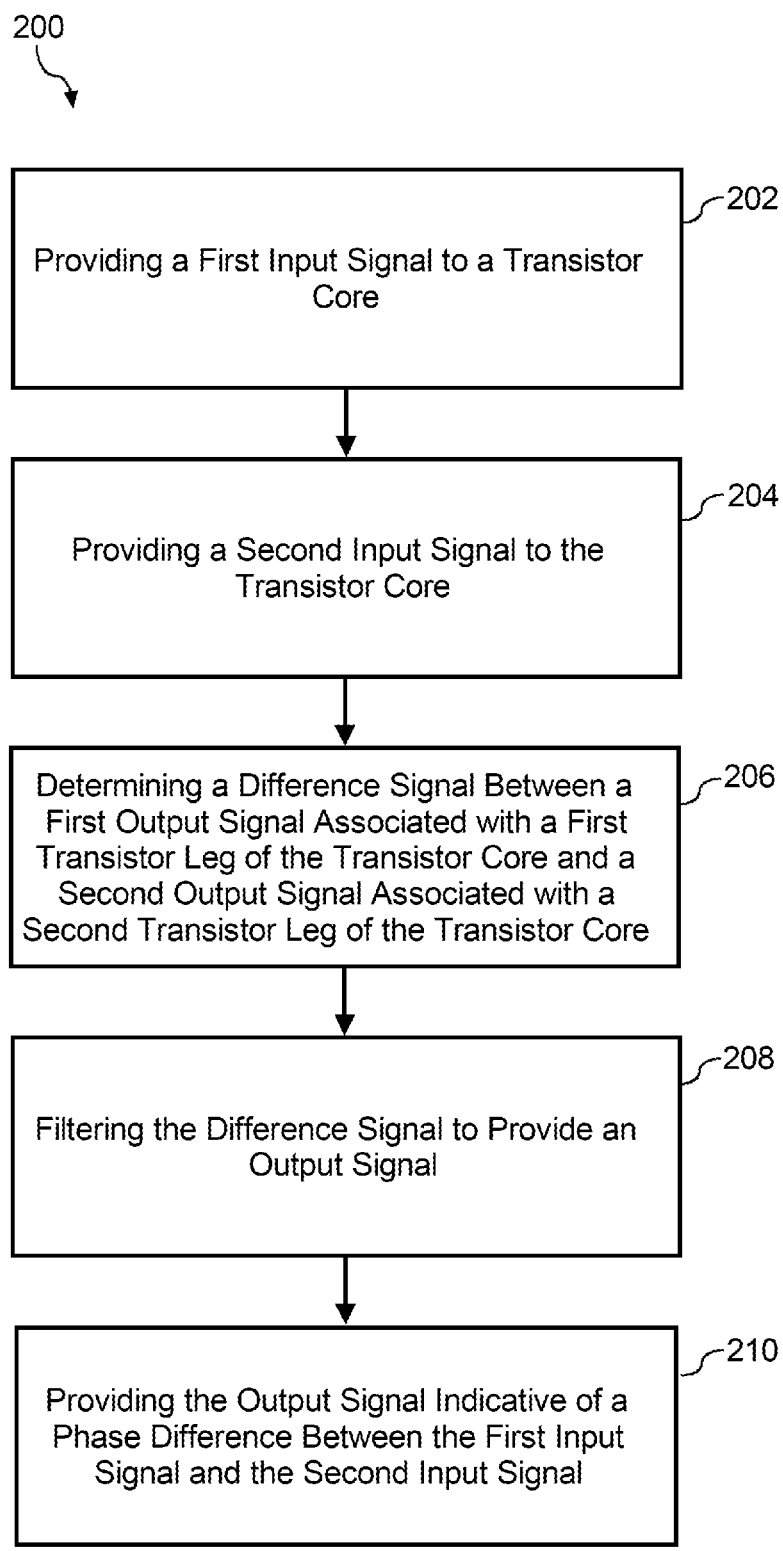
FIG. 5 depicts a flow diagram of an example method according to example embodiments of the present disclosure.

FIG. 5 depicts a flow chart of an example method 200 according to example embodiments of the present disclosure. The method 200 may be implemented using any of the phase detectors described herein, such as any of the phase detectors discussed with reference to FIGS. 1-4. FIG. 5 depicts example method steps for purposes of illustration and discussion. Those of ordinary skill in the art, using the disclosures provided herein, will understand that the steps of any of the methods described in the present disclosure may be adapted, modified, include steps not illustrated, omitted, and/or rearranged without deviating from the scope of the present disclosure.

At 202, the method includes providing a first input signal to the transistor core of a phase detector. The first input signal may be an RF signal. In some examples, the first input signal may have a frequency in a range of about 1 MHz to about 50 GHz, such as in a range of about 20 GHz to about 50 GHz. Although these examples of the range of frequency for operation of the phase detector may be regarded as typical, it may operate at much lower and much higher frequencies. In some embodiments, the first input signal is provided to one of the example transistor cores discussed with reference to FIGS. 1-4. For instance, the first input signal may be provided to a gate or to a base of a transistor in the transistor core.

At 204, the method may include providing a second input signal to the transistor core of the phase detector. The second input signal may be an RF signal. In some examples, the second input signal may have a frequency in a range of about 1 MHz to about 50 GHz, such as in a range of about 20 GHz to about 50 GHz. The second input signal may have approximately the same amplitude and/or frequency as the first input signal. In some embodiments, the second input signal is provided to one of the example transistor cores discussed with reference to FIGS. 1-4. For instance, the second input signal may be provided to a gate or to a base of a transistor in the transistor core.

At 206, the method may include determining a difference signal between a first output signal associated with a first transistor leg of the transistor core and a second output signal associated with a second transistor leg of the transistor core. Each of the first transistor leg and the second transistor leg may include a pair of transistors coupled to a common source node (or common emitter node) and a common drain node (common collector node). The difference signal may be determined, for instance, using a difference circuit. The difference circuit may be any of the difference circuits discussed with reference to FIGS. 1-4 or other suitable difference circuit.

At 208, the method may include filtering the difference signal to provide an output signal. The output signal may be the low frequency component (e.g., DC component) of the difference signal. The difference signal may be filtered using a low pass filter circuit configured to provide a band pass response for the low frequency component (e.g., DC component). The low pass filter circuit may be configured to block higher frequencies.

At 210, the method may include providing the output signal as an output of the phase detector. The output signal may include a component indicative of the phase difference between the first input signal and the second input signal.

Aspects of the present disclosure are discussed with reference to the transistor core being used in conjunction with a phase detector. The transistor core may be used for other applications without deviating from the scope of the present disclosure.

For instance, in one example, a filter circuit may be used in conjunction with the transistor core. The filter circuit may be configured to provide a bandpass response for signal components at and near a frequency that is the same as the frequency of the first input signal and the second input signal. The amplitude of the component of the output signal at the input signal frequency varies with phase difference between the two input signals. At zero phase, this component is maximized, while at 180 degrees input phase, this component approaches zero. In this example application, the output of the filter circuit would therefore be an amplitude modulated signal at the input signal frequency. In that regard, the transistor core and filter circuit would serve as a phase modulation-to-amplitude modulation converter circuit.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A phase detector, comprising:
   a first transistor leg and a second transistor leg, each of the first transistor leg and the second transistor leg comprising a pair of transistors coupled together at a plurality of common nodes;
   an input at the first transistor leg, the input configured to receive a first input signal and a second input signal;
   an output coupled to the second transistor leg, the output configured to provide an output signal;
   wherein the output signal comprises a component indicative of a phase difference between the first input signal and the second input signal.

2. The phase detector of claim 1, wherein the first transistor leg comprises a first transistor and a second transistor, the first transistor and the second transistor coupled to together at a first common source node and at a first common drain node.

3. The phase detector of claim 2, wherein the first input signal is coupled to a gate of the first transistor and the second input signal is coupled to a gate of the second transistor.

4. The phase detector of claim 2, wherein the second transistor leg comprises a third transistor and a fourth transistor, the third transistor and the fourth transistor coupled to together at the first common source node and at a second common drain node.

5. The phase detector of claim 4, further comprising a bias current source coupled to the first common source node.

6. The phase detector of claim 4, wherein a DC bias voltage is coupled to a gate of the third transistor and to a gate of the fourth transistor.

7. The phase detector of claim 6, wherein the DC bias voltage is coupled to a gate of the first transistor and to a gate of the second transistor.

8. The phase detector of claim 1, further comprising a difference circuit, the difference circuit operable to provide a difference signal as the output signal, the difference signal indicative of a difference between a first output signal associated with the first transistor leg and a second output signal associated with the second transistor leg.

9. The phase detector of claim 8, wherein the difference circuit comprises a current mirror circuit.

10. The phase detector of claim 1, further comprising a filter circuit, the filter circuit configured to provide a band pass response for a low frequency component of the difference signal, the low-frequency component indicative of the phase difference between the first input signal and the second input signal.

11. A phase detector, comprising:
    a transistor core having an input, the input operable to receive a first input signal and a second input signal;
    an output associated with the transistor core, the output configured to provide an output signal comprising a component indicative of a phase difference between the first signal and the second signal;
    wherein the transistor core comprises a first pair of transistors coupled at a first common node and a second common node, the transistor core comprising a second pair of transistors coupled to the first common node and a third common node; and
    wherein the output is provided at the third common node.

12. The phase detector of claim 11, wherein the first pair of transistors and the second pair of transistors comprise field effect transistors (FETs).

13. The phase detector of claim 11, wherein the first pair of transistors and the second pair of transistors comprise bipolar junction transistors (BJTs), insulated gate bipolar transistors (IGBTs), or high electron mobility transistors (HEMTs).

14. The phase detector of claim 11, further comprising a difference circuit providing a difference signal at the output at the third common node, the difference signal comprising a component indicative of a phase difference between the first signal and the second signal.

15. The phase detector of claim 14, wherein the difference circuit comprises a current mirror.

16. The phase detector of claim 14, wherein the difference circuit comprises a filter circuit.

17. The phase detector of claim 16, wherein the filter circuit is operable to provide a band pass response for an output signal containing a component indicative of a phase difference between the first input signal and the second input signal and to reject a component at a frequency of the first input signal and the second input signal.

18. A phase detector comprising:
    a first transistor comprising a first terminal, a second terminal, and a third terminal;
    a second transistor comprising a fourth terminal, a fifth terminal, and a sixth terminal;
    a third transistor comprising a seventh terminal, an eighth terminal, and a ninth terminal;
    a fourth transistor comprising a tenth terminal, an eleventh terminal, and a twelfth terminal;
    wherein the first terminal is operable to receive a first input signal;
    wherein the fourth terminal is operable to receive a second input signal;
    wherein the second terminal, fifth terminal, eighth terminal, and eleventh terminal are coupled at a first common node;
    wherein the third terminal and the sixth terminal are coupled at a second common node;
    wherein the ninth terminal and the twelfth terminal are coupled at a third common node; and
    wherein an output is provided at the third common node, the output configured to provide an output signal comprising a component indicative of a difference between the first input signal and the second input signal.

19. The phase detector of claim 18, wherein a bias voltage is provided to the first terminal, the fourth terminal, the seventh terminal, and the tenth terminal.

20. The phase detector of claim 18, wherein a difference circuit is configured to provide the output signal at the output.

* * * * *